United States Patent [19]

Chiu et al.

[11] Patent Number: 4,837,743
[45] Date of Patent: Jun. 6, 1989

[54] ARCHITECTURE FOR MEMORY MULTIPLEXING

[75] Inventors: Edison H. Chiu, Richardson; Jy-Der Tai, Plano; Te-Chuan Hsu, Arlington, all of Tex.

[73] Assignee: Texas Instruments Incorporated, Dallas, Tex.

[21] Appl. No.: 86,329

[22] Filed: Aug. 17, 1987

[51] Int. Cl.⁴ .................... G11C 11/40; G11C 13/00
[52] U.S. Cl. ............................ 371/51; 365/230.02;
                                        365/241; 365/189.07
[58] Field of Search ............... 371/51; 365/189, 230, 365/241

[56] References Cited

U.S. PATENT DOCUMENTS 3,402,398 9/1968 Koerner et al. ............... 365/189

Primary Examiner—Terrell W. Fears
Attorney, Agent, or Firm—Thomas R. FitzGerald; Leo N. Heiting; Melvin Sharp

[57] ABSTRACT

A solid state memory system is arranged in a plurality of blocks of memory cells, the memory cells in each block arranged in columns and rows. When the memory system is addressed for a memory reference, block selection circuitry selects one block of the plurality of blocks, excluding all of the other blocks. Each block has a set of sense amplifiers, corresponding in number to the number of bits in the output word. Each sense amplifier is connected to an isolation switch. The outputs from the sense amplifiers connected to the non-selected blocks are thereby isolated from the sense amplifier outputs from the selected block to minimize loading of the sense amplifier outputs from the selected block. The memory cells in each block are interconnected by metal row conductors and by metal column conductors.

10 Claims, 6 Drawing Sheets

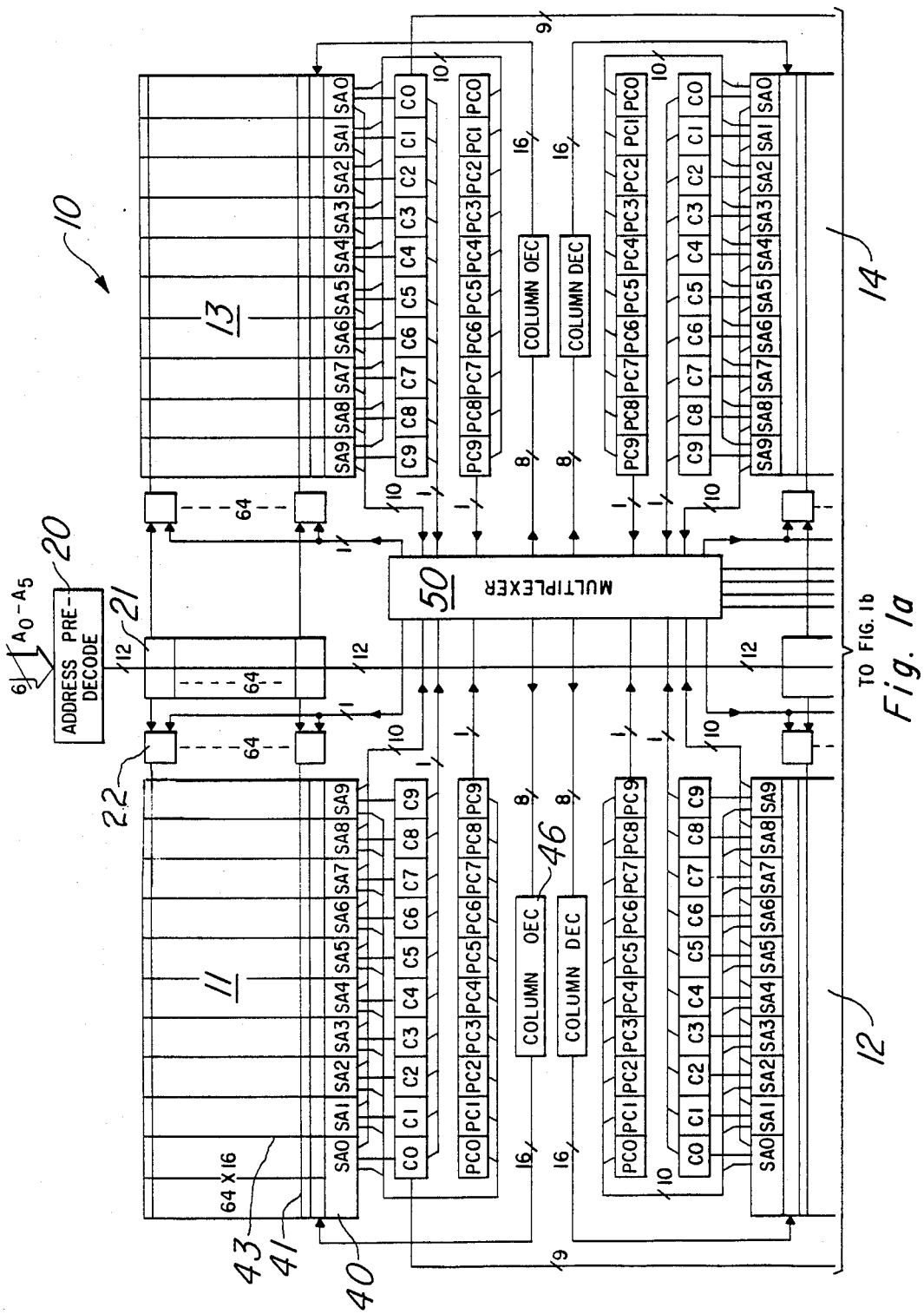

ARCHITECTURE FOR MEMORY MULTIPLEXING

BACKGROUND OF THE INVENTION

1. Field of the Invention

This invention relates to solid state memories and more particularly to memories having multiplexing architecture.

2. Description of the Prior Art

In the past, a memory system having a given number of memory cells had those cells arranged in a single array of columns and rows. Access times to such memories is limited by the length of the column and row interconnecting lines and the attendant loading, as well as the loading on the outputs of the sense amplifiers for the entire array. This loading reduces the speed of accessing such a memory.

BRIEF SUMMARY OF THE INVENTION

An addressable memory system is configured as a plurality of blocks of memory cells, the memory cells in each block being arranged in columns and rows. In this preferred embodiment, there are eight blocks.

The system uses a multiplexing technique in which three bits of the address are decoded to yield one of eight possible selections of blocks. When a particular block is selected, isolating the other blocks, the column conductor loading is reduced, resulting in higher operational speed and lower power requirements. Furthermore, the selected data written into and read from the block is carried on a bus that is isolated from the non-selected blocks which results in reducing the load on the bus and increasing speed and reducing power. In addition, the sense amplifiers of the selected block are isolated from the sense amplifiers from the non-selected blocks, which reduces loading on the output of the sense amplifiers, resulting in higher speed at a lower power requirement.

The memory cells in each of the blocks are interconnected by metal column and row conductors, which reduces the propagation delay from the row conductors to the sense amplifiers.

In this preferred embodiment, a cache memory is described. It is a CMOS, static random access memory (RAM). The invention applies equally well to all other solid state memories with cells arranged in columns and rows.

The principal object of this invention is to provide a memory system having an access time that is substantially reduced from that of an equal sized prior art memory.

Another object of this invention is to provide a memory that is divided into a plurality of blocks, with the blocks being selected individually from each other.

Another object is to decrease the loading on the column conductors to increase operational speed.

Still another object of this invention is to reduce the column current to reduce the power requirement.

These and other objects will be made evident in the detailed description that follows.

BRIEF DESCRIPTION OF THE DRAWINGS

FIGS. 1A and 1B form a partial schematic diagram of the memory system.

DETAILED DESCRIPTION OF THE INVENTION

The memory system of this invention involves dividing the memory into discrete sections which can be separately addressed in a multiplexed fashion. By providing effectively shorter drive lines and significantly reduced loading of those lines, the access speed is significantly increased and power required significantly decreased with respect to prior art memories of the same size. In this preferred embodiment, the memory is implemented in CMOS as a static RAM, and is used as a cache memory. Of course, the multiplexing technique set out in this detailed description applies as well to any other solid state memory whose cells are organized in columns and rows.

Figure 1B:
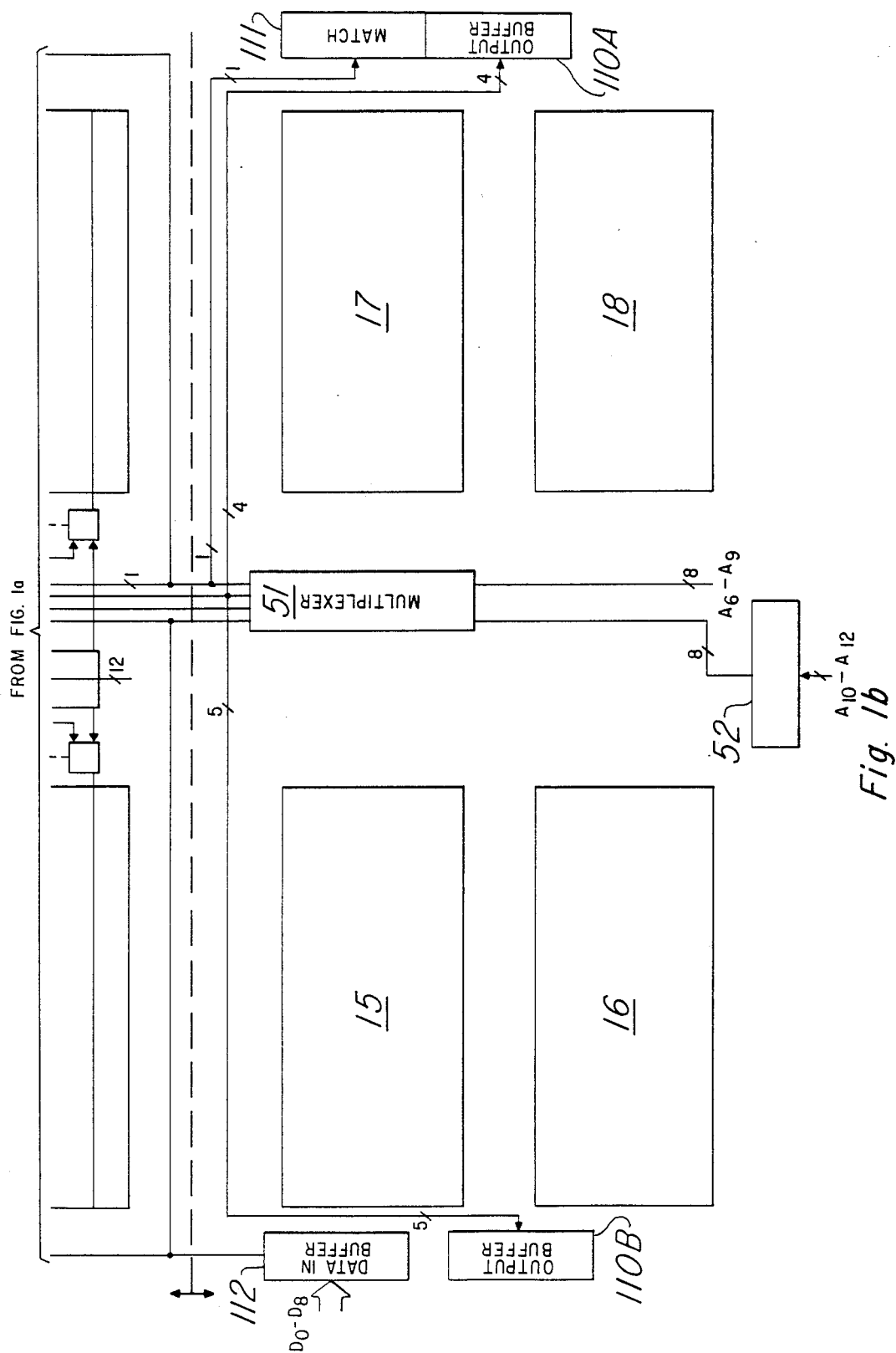

FIGS. 1A and 1B set out the memory system of this invention in some detail. As shown, blocks 11-18 the eight individual blocks of memory cells and associated circuitry.

An explanation of block 11 and its associated circuitry will serve to explain each of the blocks because they are identical to one another. Blocks 15-18 are shown only as rectangles.

Figure 5:
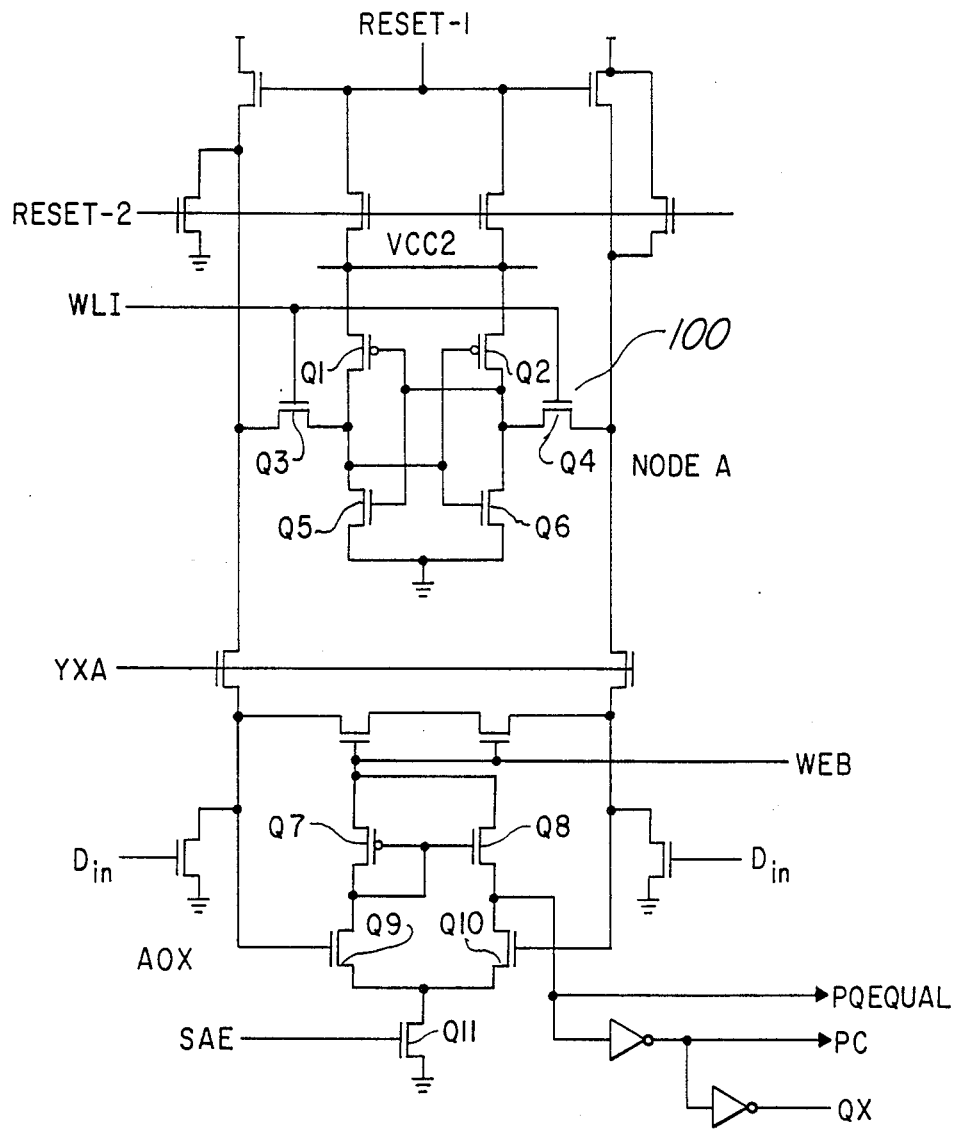
FIG. 5 is a schematic of a single memory cell coupled to a sense amplifier.

Block 11 is organized as 64 rows by 160 columns of memory cells. The memory cells are not shown in FIG. 1A, but reference to FIG. 5 illustrates a typical cell 100. These cells are activated by column conductors 43 and row conductors 41.

Referring to FIG. 1B, address bits A10-A12 are shown input to block select 52. The resultant select signal is provided at multiplexers 50 and 51 as shown.

In FIG. 1B, incoming data D0-D8 is shown entering the data-in buffer 112 with the output from buffer 112 being provided to the memory cells (see FIG. 5) as well as to the compare circuits C0-C9. Output buffers 110A and 110B receive outputs from multiplexers 50 and 51. Match buffer 111 receives its input from multiplexers 50 and 51.

In FIG. 1A, it is seen that address pre-decode 20 receives six address bits, A0-A5 as inputs. The address pre-decode 20 sends out 12 decoded bits which in turn are further decoded in decoder 21 and amplified in driver 22. Note that there are 64 such decoders and drivers. As is evident, 64 of these devices are needed for the 64 rows. The 160 columns are divided into sections of 16 columns each. These 16 columns are dedicated to a single bit in each case so that block 11 is organized as approximately 1K by 10 bits. The total memory in this preferred embodiment then is 8K by 10 bits. Note that block 11 has 10 sense amplifiers SA9-SA9 (one for parity), 10 comparators, C0-C9 and 10 parity checkers PC0-PC9. Column lines 43 are metal-clad as are row lines 41.

Figure 2:
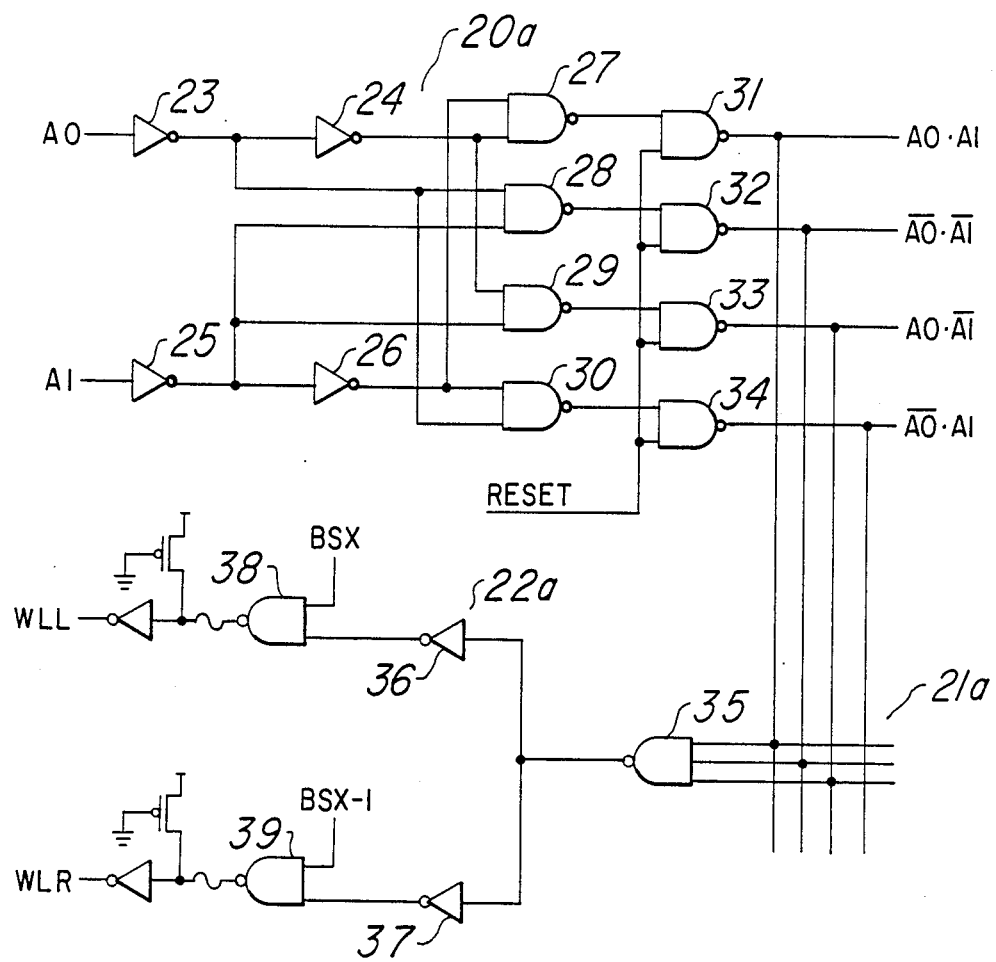
FIG. 2 is a schematic diagram illustrating one portion of the address pre-decode, decode and drivers.

Turning to FIG. 2, address pre-decode 20, decoder 21 and driver 22 are shown. Pre-decode 20A illustrates one portion of the address pre-decode. Address bits A0 and A1 are input as shown, inverted through inverters 23 and 25, respectively, and once again through inverters 24 and 26, respectively. The signals are then applied to NAND gates 27-30 in the four possible combinations, and again inverted through NAND gates 31-34 to provide the four possible combinations of output signals from these two inputs, as shown. A reset signal line is shown inputting NAND gates 31-34. The same circuitry is used to accomplish similar results for bits A2 and A3, and A4 and A5.

Decode circuit 21A is one of 64 such circuits. Sixty four NAND gates, such as NAND gate 35, each have three inputs from the gating of bits A0-A5 as described above to provide 64 unique combinations. The output from NAND gate 35 is input to driver circuit 22A (64 in all). The signal from NAND gate 35 is inverted through inverters 36 and 37 and applied to NAND gates 38 and 39, respectively. The appropriate block select signal (BSx) gates NAND gate 38 and block signal BSx−1 gates NAND circuit 39. In this way, the block 11 rows are driven by signal WLL and block 13 rows are driven by signal WLR.

Figure 3:
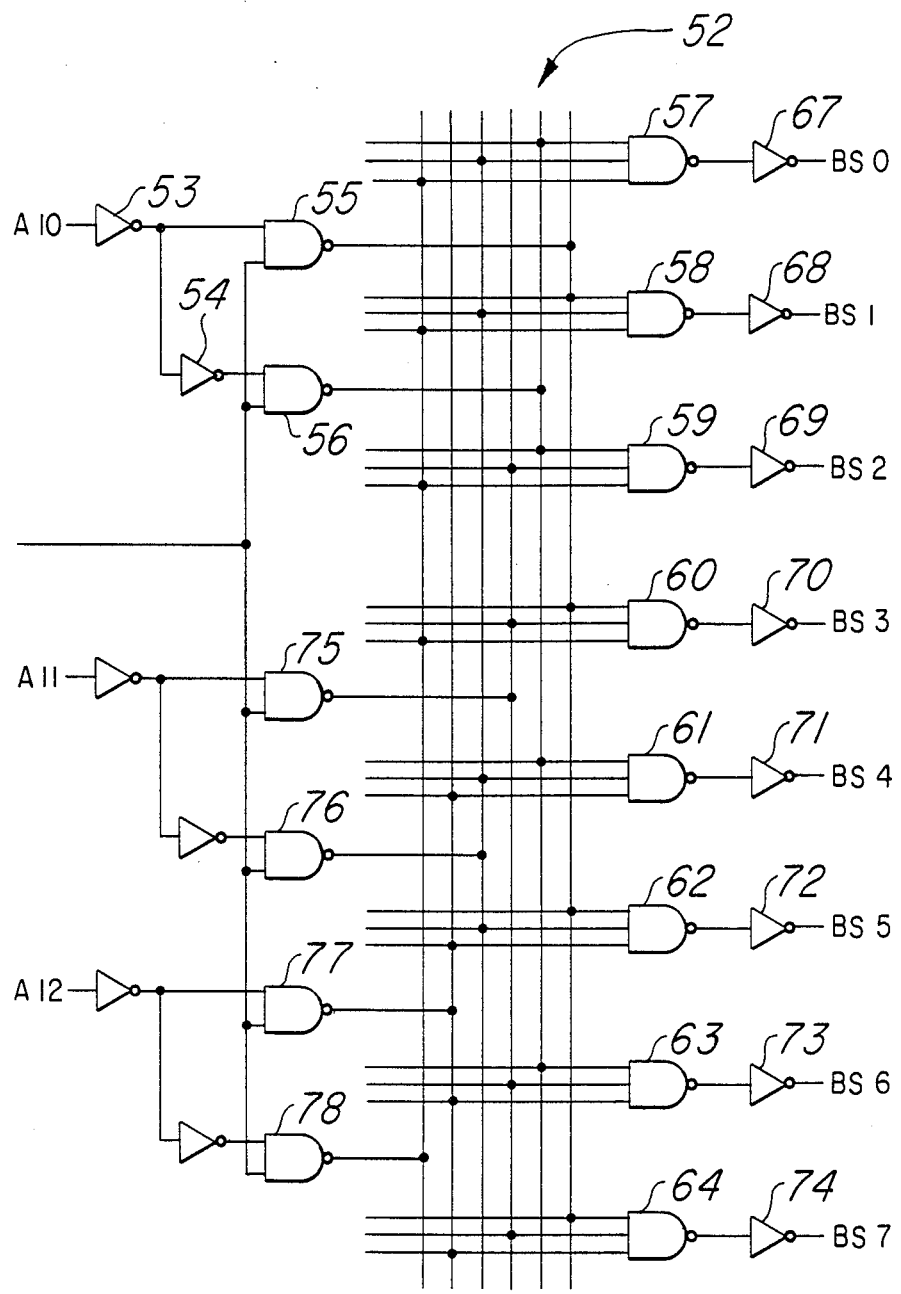
FIG. 3 is a schematic diagram illustrating the circuitry for selecting one block.

FIG. 3 illustrates block select circuitry 52. Three inputs are provided by address bits A10, A11 and A12. The reset input is used for input NAND gates 55, 56 and 75-78. To illustrate the circuitry, signal A10 is inverted through inverter 53 and applied as the other input to NAND gate 55. The output of inverter 53 is inverted again through inverter 54 and applied as an input to NAND gate 56. The output from NAND gate 55 is applied to the input NAND gates 58, 60, 62 and 64, as shown. The output from NAND gate 56 is applied to the inputs of NAND gates 57, 59, 61, and 63, as shown. The outputs from NAND gates 75-78 are applied in a similar fashion to provide the eight possible outputs resulting from the three inputs. These outputs are shown as BS0-BS7 which select blocks 11-18, respectively.

Figure 4:
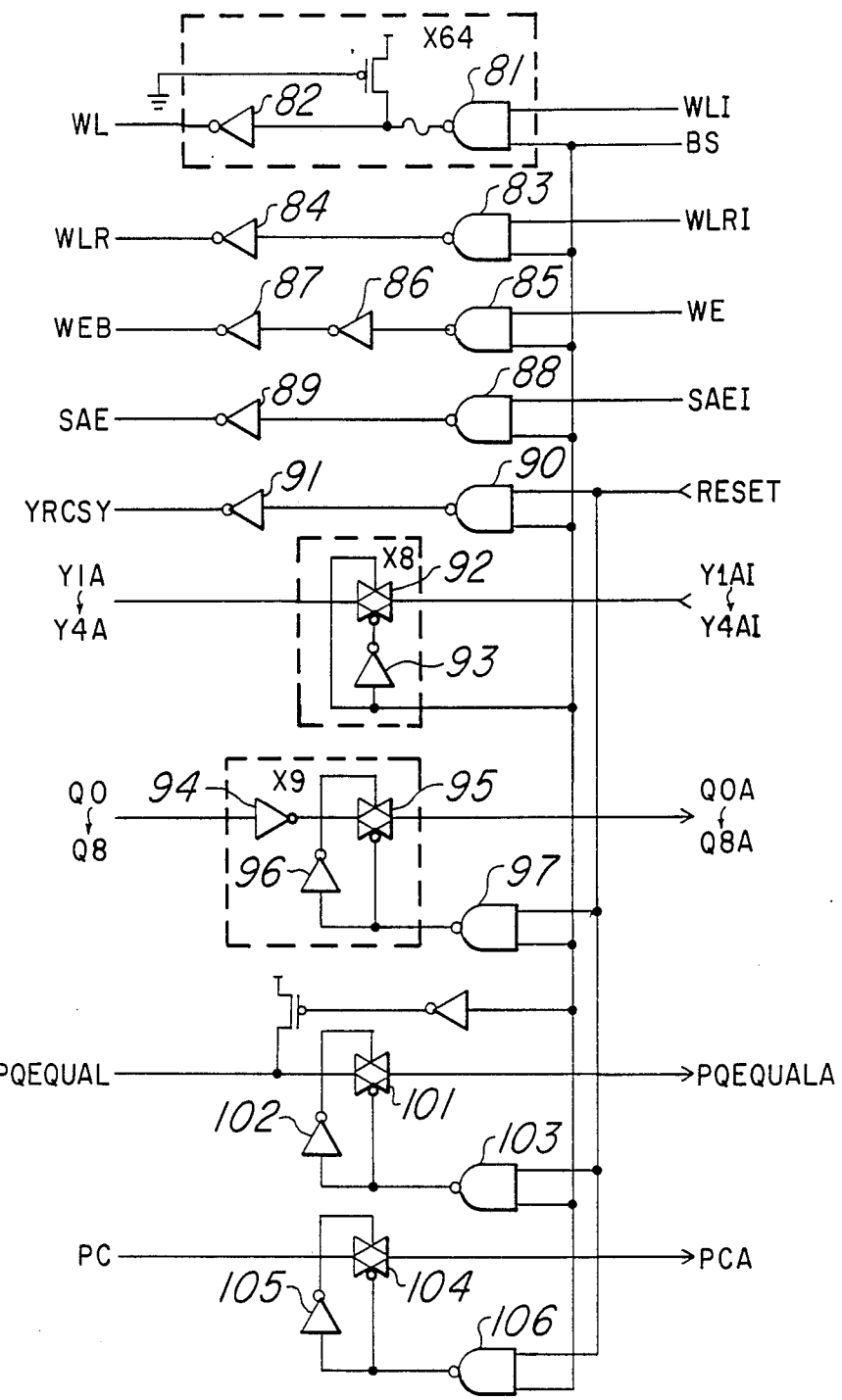
FIG. 4 is a schematic diagram of a portion of multiplexer 50.

FIG. 4 schematically illustrates a section of multiplexer 50. Multiplexer 50 has duplicate circuitry to service blocks 12, 13 and 14. The circuitry shown in FIG. 4 services block 11. Also, multiplexer 51 has four identical sections which service blocks 15-18. Signal WLI, which is the row signal, is shown coming into NAND gate 81 whose other input is provided by the approximate block select signal. The output from NAND gate 81 is inverted through inverter 82 and provides output signal WL. Signal WL is simply a redundancy signal and need not be described further. Signal WE is a write enable signal for writing data into the memory and provides an input to NAND gate 85 whose other input is provided by the block select signal. The output from NAND gate 85 is inverted twice and provides drive signal WEB.

SAEI is a signal for enabling the sense amplifiers and provides an input to NAND gate 88 whose other input is provided by the block select signal. The output from NAND gate 88 is inverted through inverter 89, providing sense amplifier enabling signal SAE.

Signal YRCSY comes from the master reset which is input to NAND gate 90 and inverted through inverter 91. It should be noted that the resetting of these circuits as shown is accomplished in a very short time because of the multiplexing technique.

Address signals A6-A9 are applied as signals Y1AI through Y4AI (as pre-decoded) and applied to isolation switch 92 directly and through inverter 93. The output from switch 92 provides signals Y1A through Y4B (including inverted signals).

Signals Q0-Q8 come from the sense amplifiers of block 11. There are nine circuits identical to that shown, with the input signal inverted by inverter 94 and input to isolation switch 95. The bit select signal and the reset signal activate NAND gate 97 whose output is gated through inverter 96 and applied to one side of switch 95, with its direct output applied to the other side. The output signals are Q0A through Q8A.

The output from comparators C0-C8 are applied as signal PQEQUAL to switch 101 which is gated by the output from NAND gate 103, inverted through inverter 102 and also applied directly to switch 101. NAND gate 103 has inputs from the block select and from the reset signal.

The parity check is shown as signal PC applied to switch 104 and output as signal PCA. This signal is gated by isolation switch 104 whose inputs are applied by the direct output from NAND gate 106 as inverted through inverter 105. The inputs to NAND gate 106 are provided the block select signal and the reset signal. The reset function also benefits from this architecture, because less current is required and the resultant reset current spike is greatly reduced and speed is greatly increased.

Note that the block select signal activates the isolation switches for the output buffer. As described earlier, this isolation feature then results in reduced loading on this output.

In this preferred embodiment, each of the 8K by 10 memory cells are made up of transistors Q1-Q6 as shown in FIG. 5. A memory cell of a different design could as well be used.

Also in FIG. 5, a schematic diagram of all of the sense amplifiers used in this invention is shown as amplifier 40X. This amplifier is made up of transistors Q7-Q11 with its output shown as signal QX which provides an output to buffer 10B. Many variations of amplifiers could be employed. In this preferred embodiment, this described architecture results in an access timing of approximately one-half of that necessary in a prior art, same size memory.

MODE OF OPERATION OF THE INVENTION

Assume that it is desired to read information from the memory system 10. An address is selected. For purposes of illustration, the address selected will apply to addresses contained in block 11. Address bits A10, A11 and A12 are applied to block select decode 52 as shown in FIG. 3. NAND gate 57 is selected, providing an output from inverter 67 as the block select signal.

Other bits of the selected address are applied in FIG. 2 as bits A0-A5. One of 64 NAND gates such as NAND gate 35 is selected to drive current WLL through a row line such as row line 41.

The remaining address bits A6-A9 are applied to switch 92 as shown in FIG. 4, the input signals being shown as Y1AI through Y4AI and output for the appropriate column as signals Y1A through Y4B. The output from the addressed memory cells is applied to sense amplifiers SA0—SA9 as shown in FIG. 1A. The individual cells are shown in detail in FIG. 5 as applying output signals to sense amplifier SAx. The output from sense amplifiers SA0-SA8 are applied to individual circuits within the multiplexer 50, shown as illustrated in FIG. 4 as isolation switch 95. The output signals Q0A-Q8A are sent to the output buffer 110B. Note that the other seven sets of isolation switches identical to isolation switch 95 isolate such other sets from that set associated with block 11. In this way, capacitive loading is greatly reduced.

If it is desired to write into the memory 10, then data is entered through data-in buffer 112. The output from buffer 112 is applied to the selected cell as indicated in FIG. 5 as $D_{IN}$ and $D-_{IN}$. This new information then can be read out as described above when desired.

Those skilled in the art realized that the invention may be practiced without copying the circuitry as set out in this preferred embodiment. The invention is limited only by the appended claims.

We claim:

1. A solid state memory state including circuitry for providing addresses to a plurality of memory cells, comprising:
   (a) a plurality of blocks of memory cells, the memory cells in each block arranged in columns and rows;
   (b) block selection means responsive to the addresses, for selecting any one of the blocks, as determined by a selected address, for a memory reference thereto at the selected address;
   (c) output means connected to receive the output from each of the blocks; and
   (d) output isolation means connected to the output means, for isolating the output means connected to the non-selected blocks from the output means connected to the selected block, to minimize loading of the output means connected to the selected block.

2. The memory system of claim 1 wherein the cells of each block are interconnected by metal row conductors.

3. The system of claim 2 wherein the cells of each block are interconnected by metal column conductors.

4. The system of claim 1 wherein the block selecting means is connected to receive a portion of the address, comprising decoding circuitry for selecting one block in correspondence with a portion of the address, causing only one block to be active during a memory reference, and minimizing the loading of the column and row conductors, and for reducing the reset current spike during system reset.

5. The system of claim 4 wherein the output means comprises a sense amplifier set for each block.

6. The system of claim 5 wherein the isolation means comprises an isolation switch connected to the output of each sense amplifier, the outputs of each of the isolation switches being tied together to provide an output for a single sense amplifier set.

7. A solid state memory system including circuitry for providing addresses to a plurality of memory cells, comprising:
   (a) a plurality of blocks of memory cells, the memory cells in each block arranged in columns and rows;
   (b) block selection means responsive to the addresses, for selecting any one of the blocks, as determined by a selected address, for a memory reference thereto at the selected address;
   (c) output means connected to receive the output from each of the blocks;
   (d) output isolation means connected to the output means, for isolating the output means connected to the non-selected blocks from the output means connected to the selected block, to minimize loading of the output means connected to the selected block;
   (e) data buffer means for receiving input data to be written into the memory system, having outputs for inputting the memory cells;
   (f) comparator means, connected to receive the outputs from the data buffer means and from the output means for comparing the input data with the information from the output means; and
   (g) comparator isolation means connected to the comparator means for isolating the comparator means connected to the non-selected blocks from the comparator means connected to the selected block, to minimize loading of the comparator means connected to the selected block.

8. The system of claim 7 wherein the comparator isolation means comprises an isolation switch connected to the output of the comparator means.

9. The system of claim 7 further comprising:
   (h) parity checking means, connected to the output means for checking the parity of the information from the output means; and
   parity isolation means for isolating the parity checking means connected to the non-selected blocks from the parity checking means connected to the selected block, to minimie loading of the parity means connected to the selected block.

10. The system of claim 9 wherein the parity isolation means comprises an isolation switch connected to the output of the parity means.

* * * * *